(12) United States Patent
Choi et al.

(10) Patent No.: US 11,908,725 B2
(45) Date of Patent: Feb. 20, 2024

(54) ELECTROSTATIC CHUCK HEATER AND MANUFACTURING METHOD THEREFOR

(71) Applicant: MICO CERAMICS LTD., Anseong-si (KR)

(72) Inventors: Jin Young Choi, Anseong-si (KR); Jun Won Seo, Anseong-si (KR); Ju Sung Lee, Anseong-si (KR)

(73) Assignee: MICO CERAMICS LTD., Anseong-si (KR)

( * ) Notice: Subject to any disclaimer, the term of this patent is extended or adjusted under 35 U.S.C. 154(b) by 246 days.

(21) Appl. No.: 17/633,177

(22) PCT Filed: Jun. 23, 2020

(86) PCT No.: PCT/KR2020/008186
§ 371 (c)(1),
(2) Date: Feb. 4, 2022

(87) PCT Pub. No.: WO2021/025287
PCT Pub. Date: Feb. 11, 2021

(65) Prior Publication Data
US 2022/0301916 A1    Sep. 22, 2022

(30) Foreign Application Priority Data
Aug. 6, 2019  (KR) .......... 10-2019-0095376

(51) Int. Cl.
*H01L 21/683* (2006.01)
*B28B 11/24* (2006.01)
(Continued)

(52) U.S. Cl.
CPC ........ *H01L 21/6833* (2013.01); *B28B 11/243* (2013.01); *C23C 14/50* (2013.01);
(Continued)

(58) Field of Classification Search
CPC .................................................. H01L 21/6833
See application file for complete search history.

(56) References Cited

U.S. PATENT DOCUMENTS

| | | | |
|---|---|---|---|
| 5,452,510 A | 9/1995 | Barnes et al. | |
| 2001/0042744 A1* | 11/2001 | Tachikawa | H05B 3/68 219/544 |

(Continued)

FOREIGN PATENT DOCUMENTS

| | | |
|---|---|---|
| JP | 2004022979 A | 1/2004 |
| KR | 10-2007-0092060 A | 9/2007 |

(Continued)

OTHER PUBLICATIONS

International Search Report dated Sep. 24, 2020.
Non-Final Office Action for KR 10-2019-0095376 from Korean Intellectual Property Office dated Apr. 8, 2022.

*Primary Examiner* — Sherman Ng
(74) *Attorney, Agent, or Firm* — BROADVIEW IP LAW, PC

(57) ABSTRACT

The present invention relates to an electrostatic chuck heater having a bipolar structure, the electrostatic chuck heater comprising: a heater body having an internal electrode and an external electrode for selectively performing any one of an RF grounding function and an electrostatic chuck function according to a semiconductor process mode; and a heater support mounted below the heater body so as to support the heater body.

12 Claims, 17 Drawing Sheets

(51) Int. Cl.
    *C23C 14/50*         (2006.01)
    *C23C 16/458*      (2006.01)
    *H05B 6/62*         (2006.01)

(52) U.S. Cl.
    CPC ........... *C23C 16/4586* (2013.01); *H05B 6/62* (2013.01); *H05B 2203/017* (2013.01)

(56) References Cited

U.S. PATENT DOCUMENTS

| | | | |
|---|---|---|---|
| 2009/0178764 A1* | 7/2009 | Kanno | H01L 21/67103 156/345.52 |
| 2012/0250212 A1 | 10/2012 | Kimura et al. | |
| 2013/0088809 A1* | 4/2013 | Parkhe | H02N 13/00 165/185 |
| 2013/0220988 A1* | 8/2013 | Kondo | H01L 21/67 219/444.1 |
| 2014/0231019 A1* | 8/2014 | Kajihara | H01L 21/67103 118/723 R |
| 2018/0310362 A1* | 10/2018 | Tsuchida | H01L 21/67103 |
| 2019/0198299 A1 | 6/2019 | Watanabe et al. | |

FOREIGN PATENT DOCUMENTS

| | | |
|---|---|---|
| KR | 101000329 B1 | 12/2010 |
| KR | 101397133 B1 | 5/2014 |
| KR | 101813289 B1 | 12/2017 |
| KR | 10-2019-0079473 A | 7/2019 |

\* cited by examiner

FIG. 5A
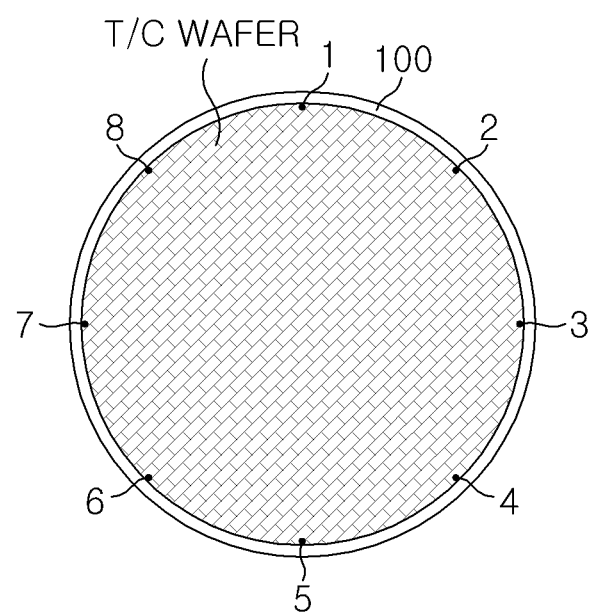
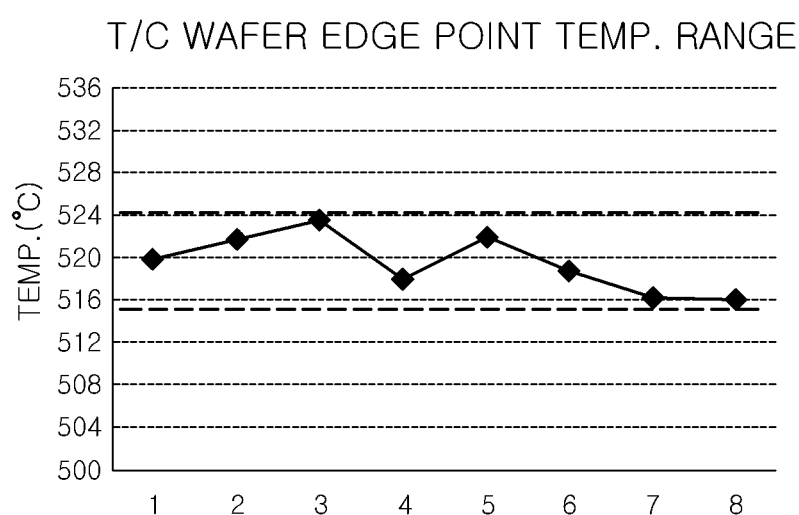

FIG. 5B
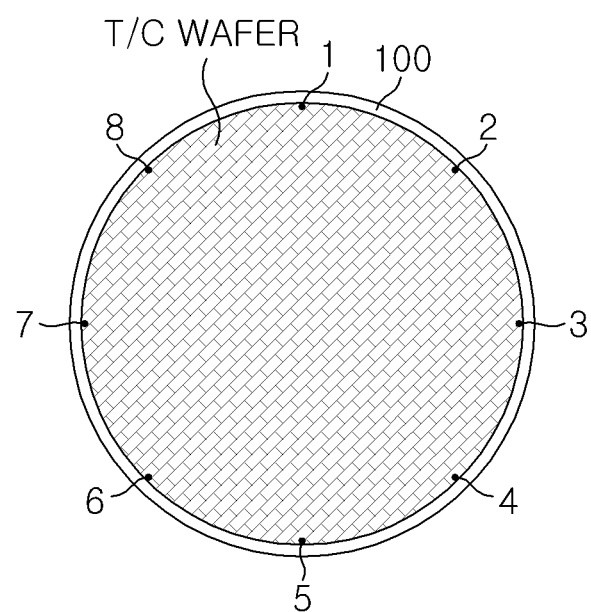
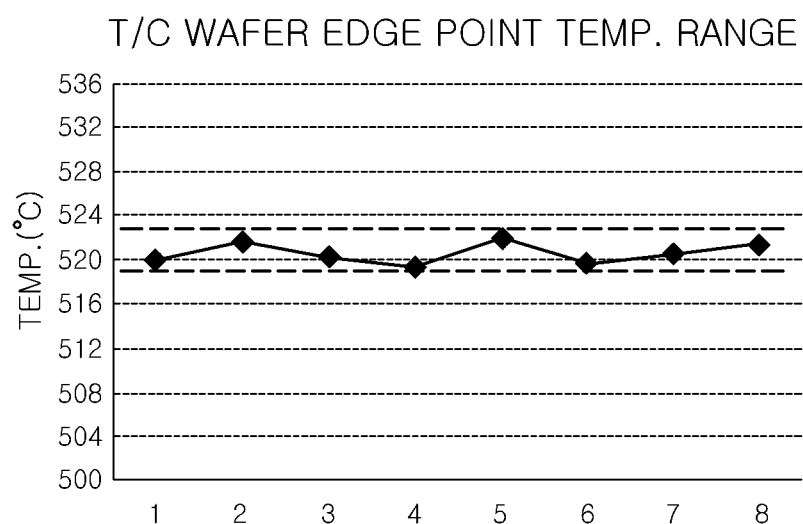

FIG. 6

| FUNCTION OF ELECTRODE | DIAMETER OF INTERNAL ELECTRODE | DIAMETER OF EXTERNAL ELECTRODE | TEMPERATURE RANGE OF WAFER EDGE |
|---|---|---|---|
| INTERNAL ELECTRODE: RF GROUND | Φ285 | Φ290~Φ320 | 3.7°C |
| EXTERNAL ELECTRODE: RF GROUND | Φ280 | Φ285~Φ320 | 4.2°C |
| | Φ275 | Φ280~Φ320 | 4.8°C |
| INTERNAL ELECTRODE: RF GROUND | Φ285 | Φ290~Φ320 | 2.7°C |
| EXTERNAL ELECTRODE: WAFER E CHUCK | Φ280 | Φ285~Φ320 | 3.2°C |
| | Φ275 | Φ280~Φ320 | 4.6°C |

FIG. 10A
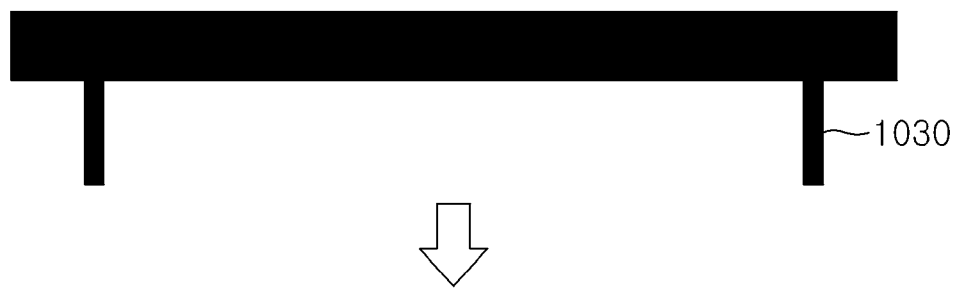
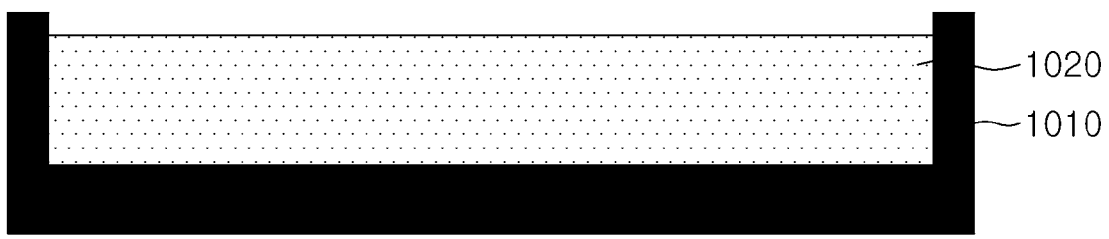

FIG. 10B
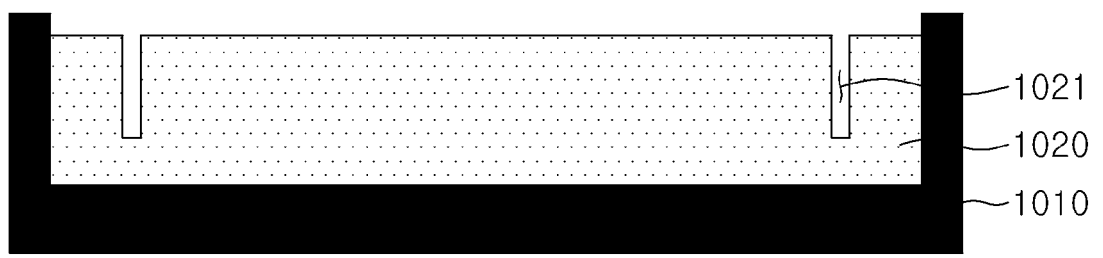
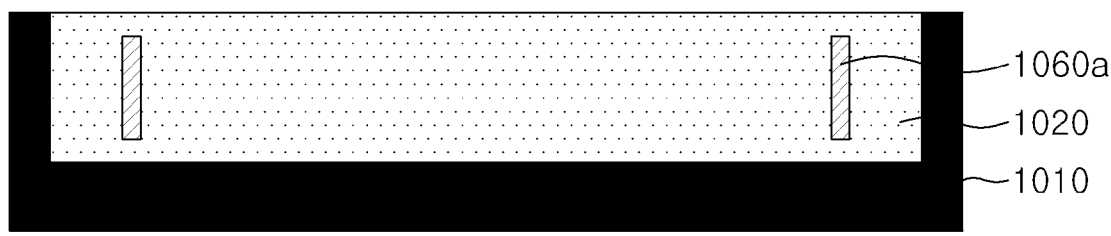
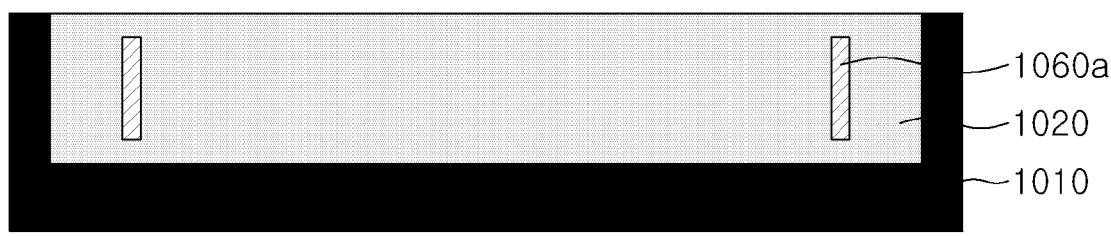

FIG. 10D
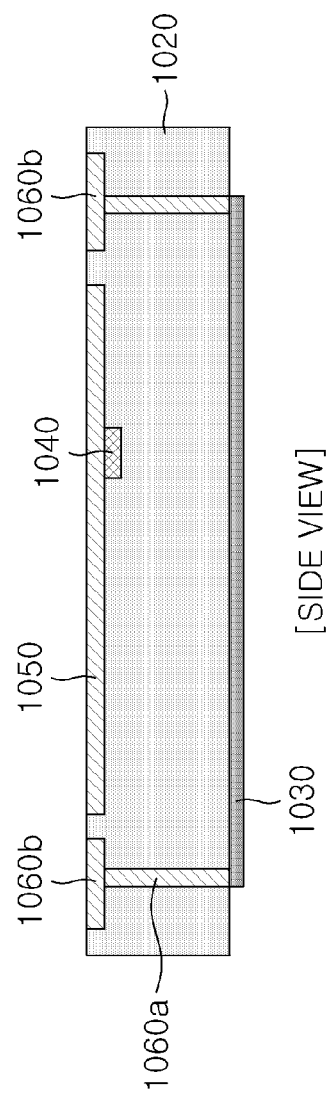
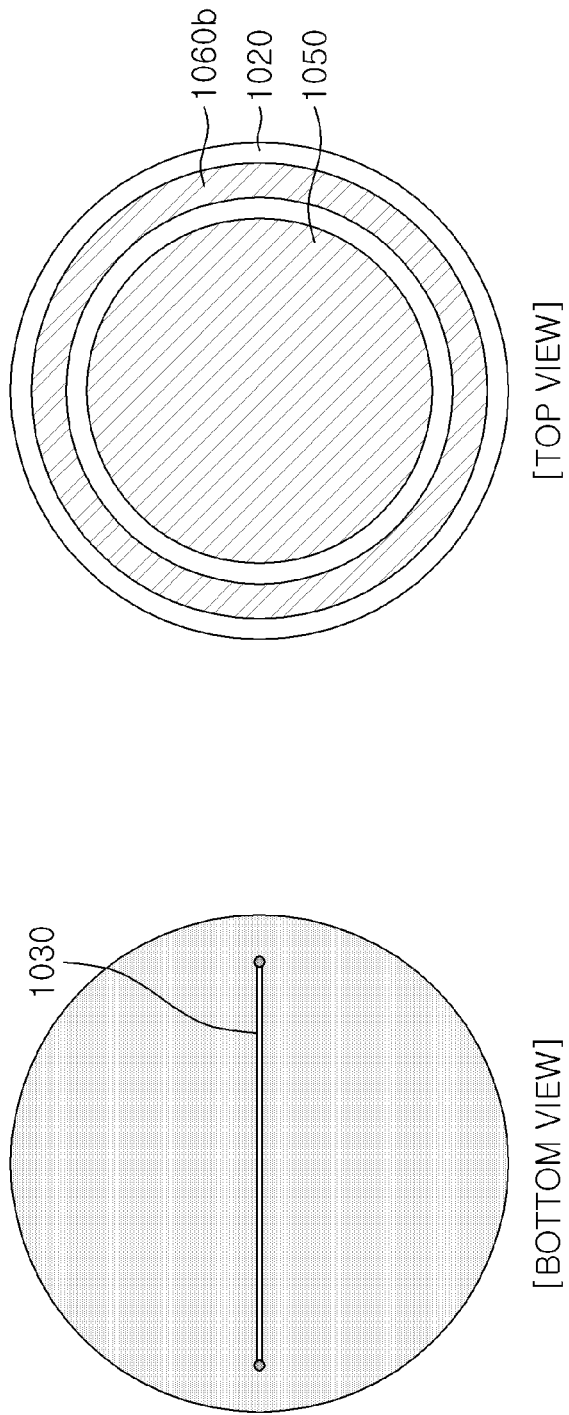

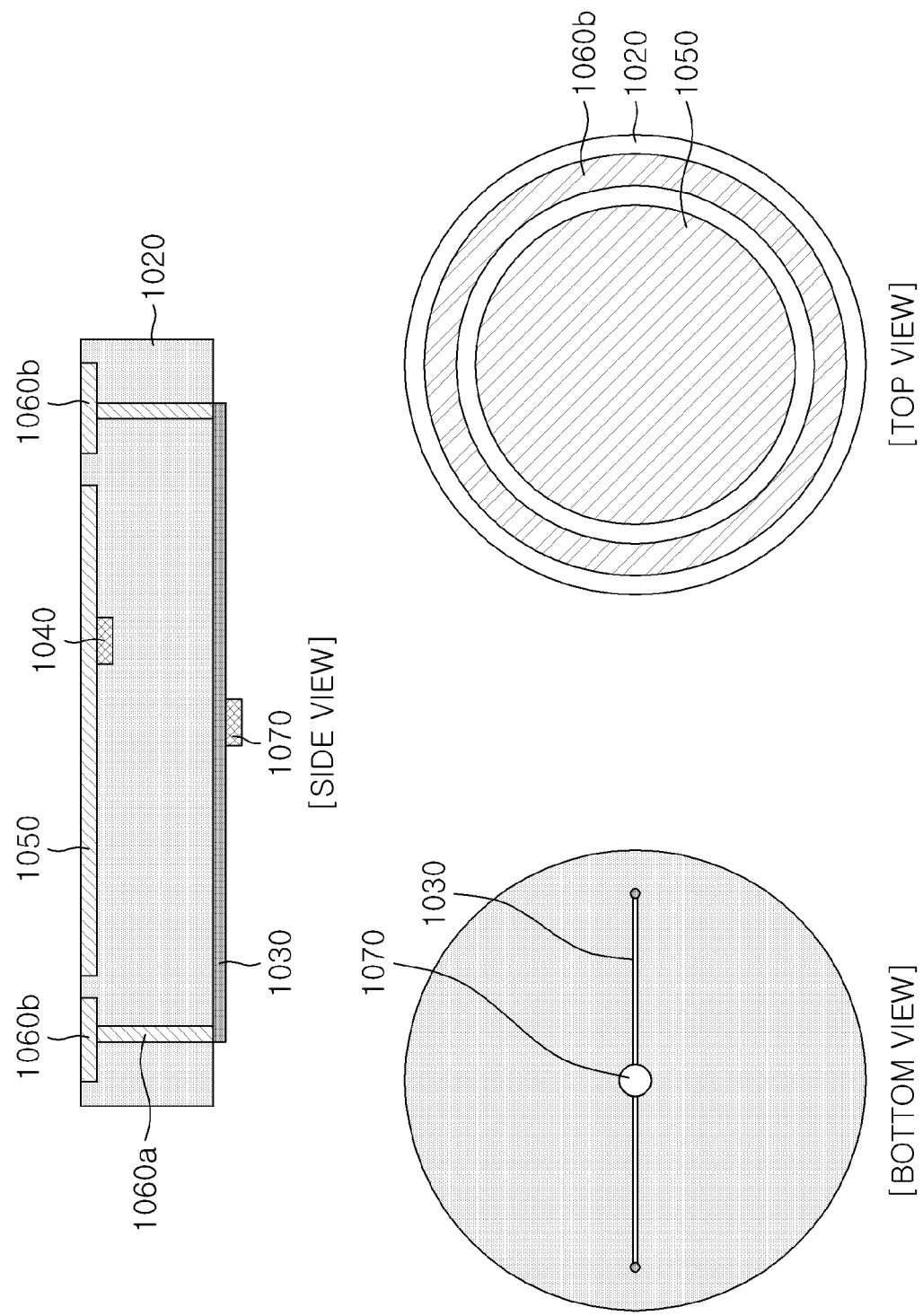

[2 LINE]

[4 LINE]

ELECTROSTATIC CHUCK HEATER AND MANUFACTURING METHOD THEREFOR

CROSS-REFERENCE TO RELATED APPLICATIONS

This application is a National Phase Entry Application of PCT Application No. PCT/KR2020/008186 filed on Jun. 23, 2020, which claims priority to Korean Patent Application No. 10-2019-0095376 filed on Aug. 6, 2019 in Korean Intellectual Property Office, the entire contents of which is hereby incorporated by reference in its entirety.

FIELD OF THE INVENTION

The present disclosure relates to an electrostatic chuck heater and a method of manufacturing the same. More particularly, the present disclosure relates to an electrostatic chuck heater having a bipolar structure and a method of manufacturing the same.

BACKGROUND OF THE INVENTION

In general, a semiconductor device or a display device is manufactured by sequentially stacking a plurality of thin film layers including a dielectric layer and a metal layer on a glass substrate, a flexible substrate, or a semiconductor wafer substrate and then patterning the thin film layers. These thin film layers are sequentially deposited on a substrate through a chemical vapor deposition (CVD) process or a physical vapor deposition (PVD) process. The CVD process includes a low-pressure chemical vapor deposition (LPCVD) process, a plasma-enhanced CVD (PECVD) process, a metal organic CVD (MOCVD) process, and the like.

A heater for supporting a glass substrate, a flexible substrate, a semiconductor wafer substrate, etc. and applying a predetermined level of heat is disposed in such a CVD apparatus and a PVD apparatus. The heater is also used for heating a substrate in an etching process of thin film layers formed on a support substrate, a firing process of a photoresist, and the like. As the heater installed in the CVD apparatus and the PVD apparatus, a ceramic heater is widely used in accordance with a demand for precise temperature control, fining of wiring lines of semiconductor elements, and precise heat treatment of a semiconductor wafer substrate.

FIG. 1 is a view illustrating a configuration of a ceramic heater according to the prior art. As illustrated in FIG. 1, a ceramic heater 1 may be used for supporting a substrate such as a wafer in a semiconductor manufacturing process, and heating the substrate to a process temperature, for example, a temperature for performing a CVD process or a PVD process.

The ceramic heater 1 includes a ceramic body 10 having a circular plate-like structure and a ceramic support 20 mounted on a lower portion of the ceramic body 10. Here, the ceramic body 10 includes a ground electrode 11 for discharging a current charged in the ceramic heater 1 to a ground when plasma is generated, and a heating element 13 for generating thermal energy for heating the substrate. The ceramic support 20 includes a ground rod 21 connecting the ground electrode 11 to the ground and a heating element rod 23 connecting the heating element 13 to an external power supply (not illustrated).

A pocket corresponding to the size of a wafer may be formed on the upper portion of the ceramic body 10 so that the wafer can be stably mounted. However, in the ceramic heater having such a pocket structure, when a process gas flows toward the wafer during a semiconductor thin film process, a vortex of gas flow may be generated through the space 30 formed between the upper surface of the ceramic body 10 and the edge of the wafer, which may cause a problem of deteriorating the deposition uniformity at the edge of the wafer.

BRIEF SUMMARY OF THE INVENTION

The present disclosure solves the above-described and other problems, and the present disclosure is to provide an electrostatic chuck heater that is improved in reliability and a method for manufacturing the same.

In addition, the present disclosure is to provide an electrostatic chuck heater having a bipolar structure and a method for manufacturing the same.

Furthermore, the present disclosure is to provide an electrostatic chuck heater capable of adaptively selecting functions of an internal electrode and an external electrode according to a semiconductor process mode, and a method for manufacturing the same.

In view of the foregoing, an electrostatic chuck heater according to an aspect of the present disclosure may include: a heater body including an internal electrode and an external electrode configured to selectively perform any one of an RF grounding function and an electrostatic chuck function according to a semiconductor process mode; and a heater support mounted below the heater body to support the heater body. Here, the internal electrode may be embedded in the upper central portion of the heater body.

In addition, the external electrode may be formed on the same plane as the internal electrode. In addition, the external electrode may be disposed to be spaced apart from the internal electrode by a predetermined distance. In addition, the external electrode may be disposed to surround the internal electrode.

In addition, the heater body may further include an external electrode connecting member disposed between the electrode layer and the heating element layer to electrically connect the external electrode and a rod installed in the heater support to each other. In addition, the external electrode connecting member may be spaced apart from the lower surfaces of the internal electrode and the external electrode by a predetermined distance and disposed in parallel to the electrodes. In addition, both ends (i.e. opposite ends) of the external electrode connecting member may be vertically bent toward the lower surface of the external electrode.

In addition, the internal electrode, the external electrode, and the external electrode connecting member may be formed in any one of a sheet type, a mesh type, and a paste type. In addition, the internal electrode, the external electrode, and the external electrode connecting member may be made of molybdenum (Mo) having excellent electrical conductivity.

In addition, the electrostatic chuck heater may further include a bipolar function selector electrically connected to the internal and external electrodes embedded in the heater body to select functions of the internal and external electrodes. Here, the bipolar function selector may include an internal electrode function selector configured to select a function of the internal electrode and an external electrode function selector configured to select a function of the external electrode. In addition, the internal electrode function selector may include a first capacitor C1, a first switch S1, and a first DC power supply configured to supply a positive DC voltage V1, and the external electrode function selector may include a second capacitor C2, a second switch S2, and a second DC power supply configured to supply a negative DC voltage V2.

In addition, the bipolar function selector may be configured to select the functions of the electrodes such that at least one of the internal electrode and the external electrode performs the RF grounding function in a first semiconductor process mode. In addition, the bipolar function selector may be configured to select the functions of the electrodes such that both the internal electrode and the external electrode perform the electrostatic chuck function in a second semiconductor process mode.

According to another aspect of the present disclosure, there is provided a method of manufacturing an electrostatic chuck heater, the method including: filling first ceramic powder into a forming mold to form a first ceramic powder layer; stacking a ceramic molding body on the first ceramic powder layer, the ceramic molding body including an internal electrode, an external electrode spaced apart from the internal electrode by a predetermined distance on a same plane as the internal electrode, and an external electrode connecting member that is in contact with the external electrode; filling second ceramic powder on the ceramic molding body to form a second ceramic powder layer; and sintering a ceramic powder layer structure including the ceramic molding body at a predetermined pressure and temperature to form a heater body. Here, the method of manufacturing the electrostatic chuck heater may further include: stacking a heating element on the second ceramic powder layer; and filling third ceramic powder on the heating element to form a third ceramic powder layer.

In addition, a method of manufacturing the ceramic molding body may include steps of: forming grooves having a predetermined shape in an upper portion of the ceramic powder layer using a jig; inserting first external electrodes into the grooves formed in the upper portion of the ceramic powder layer, and filling ceramic powder on the first external electrodes; and compacting and sintering the ceramic powder layer in which the first external electrodes are embedded to form a ceramic plate. In addition, the method of manufacturing the ceramic molding body may further include a step of forming the external electrode connecting member between the first external electrodes exposed on a lower surface of the ceramic plate using a screen printer.

In addition, the method of manufacturing the ceramic molding body may further include: processing opposite surfaces of the ceramic plate such that the first external electrodes are exposed to the exterior; forming a plurality of grooves in an upper surface of the ceramic plate; and inserting the internal electrode and the second external electrode into the plurality of grooves. Here, the second external electrode may be disposed on the first external electrodes and coupled to the first external electrodes to form a single external electrode.

BRIEF DESCRIPTION OF THE DRAWINGS

FIGS. 5A and 5B are a view illustrating graphs showing temperatures measured from edges of a ceramic heater according to the prior art and an electrostatic chuck heater according to the present embodiment, respectively;

FIG. 6 is a view showing the results of measuring the temperature change ranges of wafer edges according to the function and size of the internal and external electrodes of the electrostatic chuck heater according to the present embodiment;

FIGS. 10A to 10E are views for explaining a method of manufacturing a ceramic molding body according to another embodiment of the present disclosure.

DETAILED DESCRIPTION OF THE INVENTION

Figure 1:
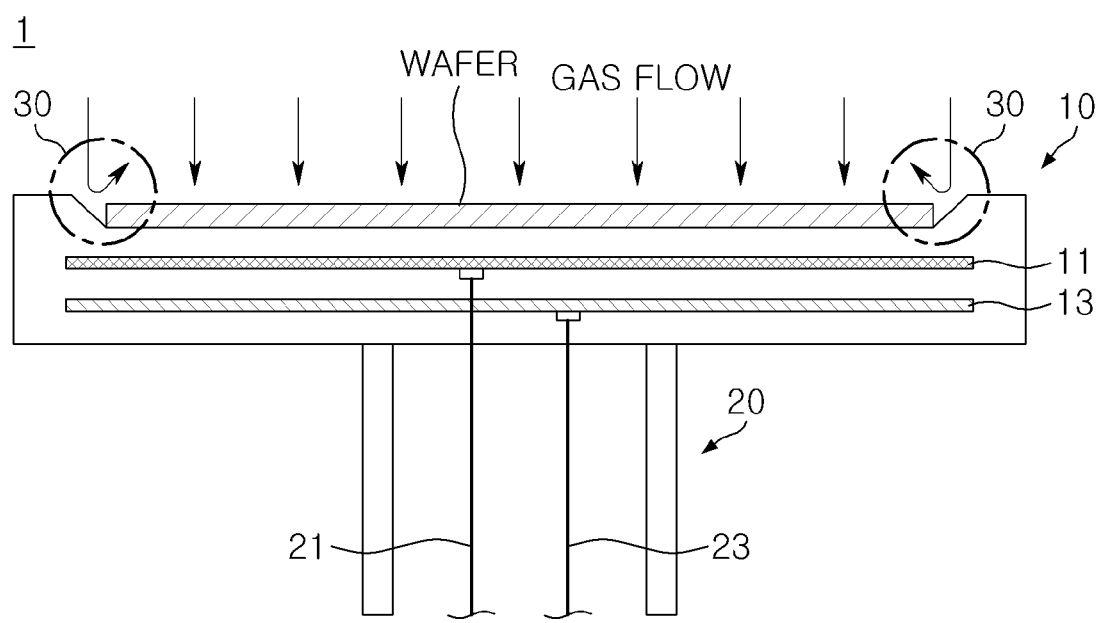
FIG. 1 is a view illustrating a configuration of a ceramic heater according to the prior art.

Hereinafter, embodiments disclosed herein will be described in detail with reference to the accompanying drawings, and regardless of reference numerals, the same or similar elements will be denoted by the same reference numerals, and redundant descriptions thereof will be omitted. Hereinafter, in the description of embodiments according to the present disclosure, when it is described that each layer (film), a region, a pattern, or structure is formed "above/on" or "below/under" a substrate, each layer (film), a region, a pad or a pattern, "formed above/on" and "formed below/under" include the case of being "directly formed" or "indirectly formed via another layer". In addition, the criterion for above/on or below/above for each layer will be described with reference to the drawings. In the drawings, the thickness or size of each layer is exaggerated, omitted, or schematically illustrated for convenience and clarity of description. In addition, the size of each component does not fully reflect the actual size.

In addition, in describing the embodiments disclosed herein, when it is determined that a detailed description of related known technologies may obscure the subject matter of the embodiments disclosed herein, the detailed description thereof will be omitted. Furthermore, the accompanying drawings are provided for easy understanding of the embodiments disclosed herein, and the technical idea disclosed herein is not limited by the accompanying drawings, and it shall be understood that all changes, equivalents, or substitutes of the embodiments fall within the spirit and scope of the present disclosure.

The present disclosure proposes an electrostatic chuck heater improved in reliability and a method of manufacturing the same. In addition, the present disclosure proposes an electrostatic chuck heater having a bipolar structure and a method of manufacturing the same. Furthermore, the present disclosure proposes an electrostatic chuck heater capable of adaptively selecting functions of an internal electrode and an external electrode according to a semiconductor process mode, and a method for manufacturing the same.

Hereinafter, various embodiments of the present disclosure will be described in detail with reference to the drawings.

Figure 2:
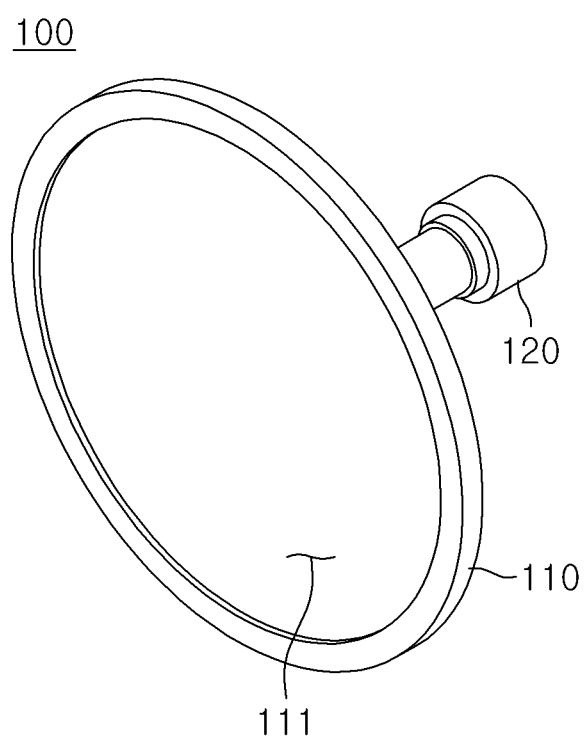
FIG. 2 is a perspective view illustrating an external shape of an electrostatic chuck heater according to an embodiment of the present disclosure.
Figure 3:
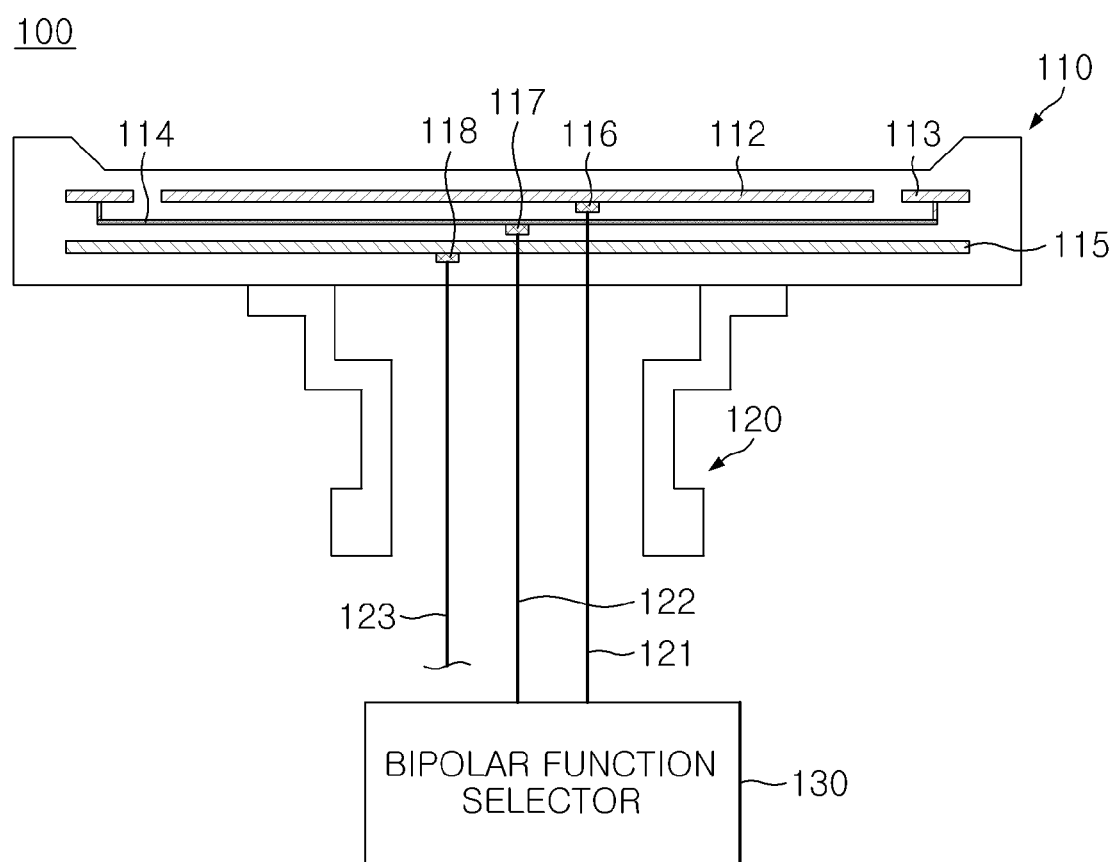
FIG. 3 is a cross-sectional view illustrating a configuration of the electrostatic chuck heater according to an embodiment of the present disclosure.
Figure 4:
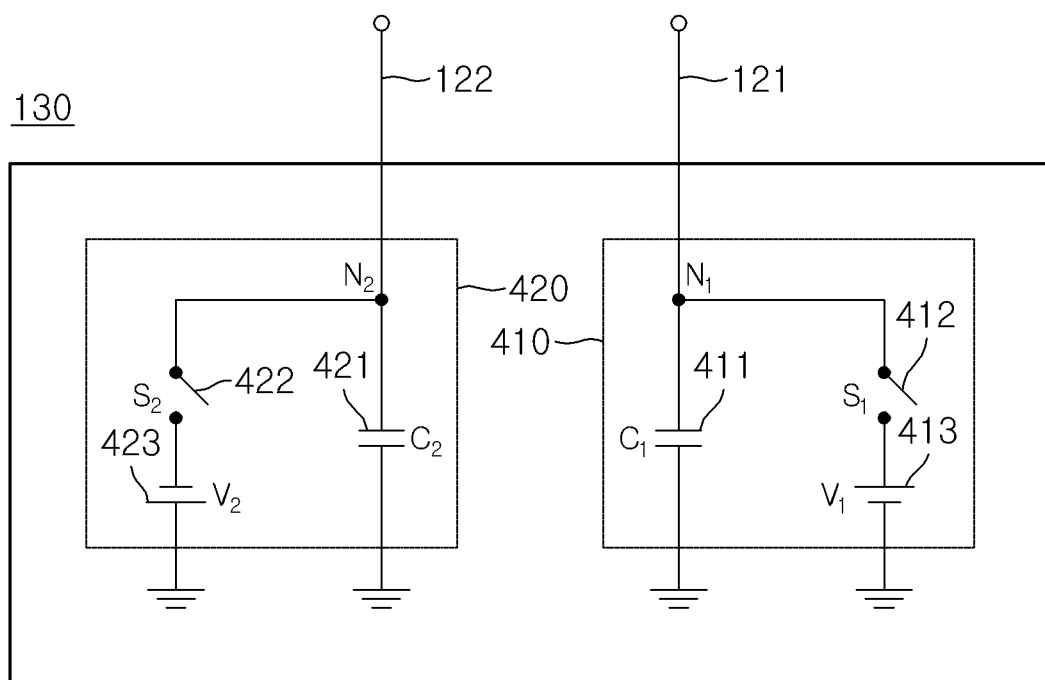
FIG. 4 is a view illustrating a configuration of a bipolar function selector included in the electrostatic chuck heater of FIG. 3.

FIG. 2 is a perspective view illustrating an external shape of an electrostatic chuck heater according to an embodiment of the present disclosure, FIG. 3 is a cross-sectional view illustrating a configuration of the electrostatic chuck heater according to an embodiment of the present disclosure, and FIG. 4 is a view illustrating a configuration of a bipolar function selector included in the electrostatic chuck heater of FIG. 3.

Referring to FIGS. 2 to 4, an electrostatic chuck heater 100 according to an embodiment of the present disclosure is a semiconductor apparatus that simultaneously provides a heat treatment function for heating a heat treatment target for various purposes, such as a semiconductor wafer, a glass substrate, or a flexible substrate, to a predetermined temperature and an electrostatic chuck function for bringing the heat treatment target into close contact with the upper surface of the heater 100.

The electrostatic chuck heater 100 may include a heater body 110 configured to transmit heat while stably supporting a heat treatment target (not illustrated), a heater support 120 mounted on the lower portion of the heater body 110, and a bipolar function selector 130 electrically connected to the heater body 110. Here, the bipolar function selector 130 may be formed integrally with the electrostatic chuck heater 100 or formed independently of the electrostatic chuck heater 100.

The heater body 110 may be formed in a plate-shaped structure having a predetermined shape. For example, the heater body 110 may be formed in a circular plate-shaped structure, but is not necessarily limited thereto.

A pocket region (or a cavity region) 111 having a structure recessed with a predetermined level difference may be formed in the upper portion of the heater body 110 such that a heat treatment target, such as a wafer, can be stably mounted. The upper surface of the heater body 110 corresponding to the pocket region may be formed to have excellent flatness. This is to dispose a heat treatment target installed in the chamber such that the heat treatment target is arranged horizontally without being inclined in one direction.

The heater body 110 may include a plurality of ceramic plates (not illustrated) formed of a ceramic material having excellent thermal conductivity, and may be formed through a process of compacting and sintering the plurality of ceramic plates. Here, the ceramic material may be any one of Al2O3, Y2O3, Al2O3/Y2O3, ZrO2, autoclaved lightweight concrete (AlC), TiN, AlN, TiC, MgO, CaO, CeO2, TiO2, BxCy, BN, SiO2, SiC, YAG, mullite, and AlF3, and more preferably aluminum nitride (AlN).

The heater body 110 may include an internal electrode 112, an external electrode 113 surrounding the internal electrode 112, an external electrode connecting member 114 under the electrodes 112 and 113, a heating element 115 under the external electrode connecting member 114, and first to third rod connecting members connecting member 116 to 118.

The internal electrode 112 may be disposed in the upper center of the heater body 110, and may be formed in a circular plate shape. The internal electrode 112 may be disposed inside the external electrode 113.

The internal electrode 112 may be formed in any one of a mesh type, a sheet type, and a paste type, and more preferably a mesh type. In addition, the internal electrode 112 may be formed of tungsten (W), molybdenum (Mo), silver (Ag), gold (Au), niobium (Nb), titanium (Ti), aluminum nitride (AlN), or an alloy thereof, and more preferably molybdenum (Mo).

The thickness of the internal electrode 112 may be 0.1 to 0.5 mm, and more preferably 0.2 mm. In addition, the diameter of the internal electrode 112 may be 280 to 290 mm, and more preferably 285 mm.

The internal electrode 112 may selectively perform any one of a radio frequency (RF) grounding function and an electrostatic chuck function. Here, the RF grounding function is a function of discharging a current charged in the heater body 110 to an external ground due to plasma inside the chamber during a deposition process for a wafer, and the electrostatic chuck function is a function of bringing a heat treatment target such as a wafer into close contact with the upper surface of the heater body 110 using an electric field.

The external electrode 113 is disposed on the upper edge of the heater body 110, and may be formed in a circular ring shape. The external electrode 113 may be formed on the same plane as the internal electrode 112. In addition, the external electrode 113 may be formed to surround the internal electrode 112 in the state of being spaced apart from the internal electrode 112 by a predetermined distance.

The external electrode 113 may be formed in any one of a mesh type, a sheet type, and a paste type, and more preferably a mesh type. In addition, the external electrode 113 may be formed of tungsten (W), molybdenum (Mo), silver (Ag), gold (Au), niobium (Nb), titanium (Ti), aluminum nitride (AlN), or an alloy thereof, and more preferably molybdenum (Mo).

The thickness of the external electrode 113 may be 0.1 to 0.5 mm, and more preferably 0.2 mm. In addition, the inner diameter/outer diameter of the external electrode 113 may be 280 mm/320 mm to 300 mm/320 mm, and more preferably 290 mm/320 mm.

The external electrode 113 may selectively perform any one of the RF grounding function and the electrostatic chuck function. Likewise, the RF grounding function is a function of discharging a current charged in the heater body 110 to an external ground due to plasma inside the chamber during a deposition process for a wafer, and the electrostatic chuck function is a function of bringing a heat treatment target such as a wafer into close contact with the upper surface of the heater body 110 using an electric field.

Meanwhile, since the external electrode 113 is disposed to be spaced apart from the internal electrode 112 by a predetermined distance on the same plane as the internal electrode 112, there is a problem in that it is difficult to connect the external electrode 113 directly to the second rod 122 provided in the central portion of the heater body 110. To solve this problem, the external electrode connecting member 114 may be embedded in the heater body 110.

The external electrode connecting member 114 is disposed between an electrode layer and a heating element layer, and performs a function of electrically connecting the external electrode 113 and the second rod 122 to each other. That is, by the external electrode connecting member 114, the second rod 122 located in the central portion of the heater body 110 and the external electrode 113 located in the edge portion of the heater body 110 can be electrically connected to each other. Accordingly, the first to third rods 121 to 123 of the internal electrode 112 and the external electrode 113, and the heating element 115, which are embedded in the heater body 110, may be located together in the central portion of the heater support 120.

The external electrode connecting member 114 may be provided to extend in a horizontal direction between the electrode layer and the heating element layer of the heater body 110. In addition, the external electrode connecting member 114 may be spaced apart from the lower surfaces of the internal electrode 112 and the external electrode 113 by a predetermined distance and disposed in parallel to the electrodes 112 and 113. The external electrode connecting member 114 may be formed in a narrow and long plate shape. Both ends of the external electrode connecting member 114 may be vertically bent upward. This is to bring the both ends of the external electrode connecting member 114 into contact with the lower surface of the external electrode 113.

The external electrode connecting member 114 may be formed in any one of a mesh type, a sheet type, and a paste type, and more preferably, may be formed in a sheet type. In addition, the external electrode connecting member 114 may be formed of tungsten (W), molybdenum (Mo), silver (Ag), gold (Au), niobium (Nb), titanium (Ti), aluminum nitride (AlN), or an alloy thereof, and more preferably, may be made of molybdenum (Mo).

The heating element 115 may be disposed in the lower center of the heater body 110, and may be formed in a shape corresponding to the shape of a heat treatment target. The heating element 115 may be disposed below the external electrode connecting member 114 to be spaced apart from the internal and external electrodes 112 and 113 by a predetermined distance.

The heating element 115 may be embedded in the heater body 110 corresponding to the position of the heat treatment target. In addition, the heating element 115 may be embedded in the heater body 110 in parallel with the heat treatment target to be capable of not only uniformly controlling the heating temperature according to the position in order to uniformly heat the entire heat treatment target, but also maintaining the distance at which heat is transferred to the heat treatment target constant at almost all positions.

The heating element 115 may be formed in a plate-shaped coil shape or a flat plate shape by a heating wire (or a resistance wire). In addition, the heating element 115 may be formed in a multi-layered structure for precise temperature control.

The heating element 115 performs a function of heating the heat treatment target located on the upper surface of the heater body 110 to a constant temperature in order to perform a vapor deposition process and an etching process smoothly in a semiconductor manufacturing process.

The first rod connecting member 116 is disposed on the central lower surface of the internal electrode 112, and performs a function of electrically connecting the internal electrode 112 and the first rod 121 to each other. The second rod connecting member 117 is disposed on the central lower surface of the external electrode connecting member 114, and functions to electrically connect the external electrode 113 and the second rod 122 to each other. The third rod connecting member 118 is disposed on the central lower surface of the heating element 115, and functions to electrically connect the heating element 115 and the third rod 123 to each other.

The heater support 120 is mounted on the lower portion of the heater body 110, and serves to support the heater body 110. Accordingly, the heater support 120 is coupled to the heater body 110 to constitute the electrostatic chuck heater 100 having a T-shape.

The heater support 120 may be formed of a tube having a cylindrical shape having an empty space therein. This is to install, through the heater support 120, a plurality of rods 121 to 123 connected to the internal electrode 112, the external electrode 113, and the heating element 115 of the heater body 110.

The heater support 120 may be formed of the same ceramic material as the heater body 110. As an example, the heater support 120 may be formed of any one of Al2O3, Y2O3, Al2O3/Y2O3, ZrO2, autoclaved lightweight concrete (AlC), TiN, AlN, TiC, MgO, CaO, CeO2, TiO2, BxCy, BN, SiO2, SiC, YAG, mullite, and AlF3, and more preferably, aluminum nitride (AlN).

The first rod 121 may be installed inside the heater support 120 to connect the first rod connecting member 116 and the bipolar function selector 130 to each other. Accordingly, the bipolar function selector 130 may be electrically connected to the internal electrode 112 via the first rod 121.

The second rod 122 may be installed inside the heater support 120 to connect the second rod connecting member 117 and the bipolar function selector 130 to each other. Accordingly, the bipolar function selector 130 may be electrically connected to the external electrode 113 via the second rod 122.

The third rod 123 may be installed inside the heater support 120 to connect the third rod connecting member 118 and an external power supply (not illustrated) to each other. Accordingly, the external power supply may be electrically connected to the heating element 115 via the third rod 123.

The first to third rods 121 to 123 may be formed of a metal material having excellent electrical conductivity. For example, the first to third rods 121 to 123 may be formed of copper (Cu), aluminum (Al), iron (Fe), tungsten (W), nickel (Ni), silver (Ag), gold (Au), niobium (Nb), titanium (Ti), or an alloy thereof, and more preferably, nickel (Ni).

The bipolar function selector 130 may be electrically connected to the internal electrode 112 and the external electrode 113 via the first and second rods 121 and 122, respectively, and may adaptively select the functions of the internal electrode 112 and the external electrode 113 according to a semiconductor process mode. That is, in order to make the internal electrode 112 and the external electrode to perform one of the RF grounding function and the electrostatic chuck function according to a semiconductor process mode, the bipolar function selector 130 may select the functions of the electrodes 112 and 113.

For example, as illustrated in FIG. 4, the bipolar function selector 130 may include an internal electrode function selector 410 and an external electrode function selector 420 configured to select the function of the internal electrode 112 and the function of the external electrode 113, respectively, in response to a control command of a semiconductor process system (not illustrated).

The internal electrode function selector 410 is electrically connected to the internal electrode 112 via the first rod 121, and may include a first capacitors (C1) 411, a first switch (S1) 412, and a first DC power supply (V1) 413. Here, the first capacitor 411 may be connected in parallel to the first switch 412 and the first DC power supply 413 with respect to a first node N1. The first switch 412 and the first DC power supply 413 may be connected in series between the first node and the ground. In addition, the first DC power supply 413 may provide a predetermined positive DC voltage.

When the first switch 412 operates in a turned-off state in response to a control signal of the semiconductor process system, the internal electrode 112 of the electrostatic chuck heater 100 is connected to the first capacitor 411. Since the first capacitor 411 operates in a short state in a radio-frequency (RF) operation mode, the internal electrode 112 is connected to an external ground to perform an RF grounding function.

Meanwhile, when the first switch 412 operates in a turned-on state in response to a control signal of the semiconductor process system, the internal electrode 112 of the electrostatic chuck heater 100 is connected to the first DC power supply 413. Accordingly, the internal electrode 112 performs an electrostatic chuck function based on a positive DC voltage applied from the first DC power supply 413.

The external electrode function selector 420 is electrically connected to the external electrode 113 via the second rod 122, and may include a second capacitors (C2) 421, a second switch (S2) 422, and a second DC power supply (V2) 423. Here, the second capacitor 421 may be connected in parallel to the second switch 422 and the second DC power supply 423 with respect to a second node N2. The second switch 422 and the second DC power supply 423 may be connected in series between the second node and the ground. In addition, the second DC power supply 423 may provide a predetermined negative DC voltage.

When the second switch 422 operates in the turned-off state in response to a control signal of the semiconductor process system, the external electrode 113 of the electrostatic chuck heater 100 is connected to the second capacitor 421. Since the second capacitor 421 operates in a short state in the radio-frequency (RF) operation mode, the external electrode 113 is connected to the external ground to perform an RF grounding function.

Meanwhile, when the second switch 422 operates in the turned-on state in response to a control signal of the semiconductor process system, the external electrode 113 of the electrostatic chuck heater 100 is connected to the second DC power supply 423. Accordingly, the external electrode 113 performs the electrostatic chuck function based on the negative DC voltage applied from the second DC power supply 423.

TABLE 1

| Semiconductor process mode | Switching Mode | | Function of Electrode | |
|---|---|---|---|---|
| | Switch 1 | Switch 2 | Internal electrode | External electrode |
| No Plasma process | On | On | Electrostatic chuck | Electrostatic chuck |
| Plasma process | Off | Off | RF ground | RF ground |
| | Off | On | RF ground | Electrostatic chuck |
| | On | Off | Electrostatic chuck | RF ground |

As shown in Table 1 above, the bipolar function selector 130 may adaptively select the functions of the internal electrode and the external electrode to allow the internal electrode and the external electrode to operate in any one of the RF grounding function and the electrostatic chuck function according to the switching mode of switches 1 and 2.

For example, in a semiconductor process mode using plasma (a first semiconductor process mode), the bipolar function selector 130 may select the functions of the internal and external electrodes 112 and 113 such that at least one of the internal electrode 112 and the external electrode 113 performs the RF grounding function. Meanwhile, in a semiconductor process mode that does not use plasma (a second semiconductor process mode), the bipolar function selector 130 may apply DC voltages having different polarities to the internal electrode 112 and the external electrode 113 to select the functions of the internal and external electrodes 112 and 113 such that both the electrodes perform the electrostatic chuck function.

According to the electrostatic chuck heater 100 according to the present embodiment, a heat treatment target such as a wafer is divided into a portion having good deposition uniformity (e.g., the central portion of a wafer) and a portion having poor deposition uniformity (e.g., the edge portion of a wafer), and an electrode having an RF grounding function is provided in the portion having good deposition uniformity, and an electrode having an electrostatic chuck function is provided in the portion having poor deposition uniformity. Thus, there is an effect that a charged heat treatment target such as a wafer can be fixed to the upper surface of the heater body. As a result, since the contact surface between the heat treatment target such as a wafer and the heater body increases, thermal conductivity is improved, and accordingly, temperature uniformity and deposition uniformity of the heat treatment target are improved.

As described above, the electrostatic chuck heater according to an embodiment of the present disclosure includes an internal electrode and an external electrode capable of selectively performing any one of an RF grounding function and an electrostatic chucking function according to a semiconductor process mode, whereby the temperature uniformity and deposition uniformity of a heat treatment target such as a wafer disposed on the upper surface of the heater body can be improved.

FIGS. 5A and 5B are a view illustrating graphs showing temperatures measured from edges of a ceramic heater according to the prior art and an electrostatic chuck heater according to the present embodiment, respectively.

As shown in FIGS. 5A and 5B, in order to test the effect of the present disclosure, the temperatures of eight (8) points of the edges of the heaters were measured and compared using T/C wafers. The temperature of each heater was set at about 550° C. As the ground electrode of the ceramic heater according to the prior art, a mesh type (24 mesh) electrode having a diameter of 320 mm was used.

In addition, an experiment was conducted using a mesh type (24 mesh) electrode having a diameter of 285 mm as the internal electrode (i.e., the ground electrode) of the electrostatic chuck heater according to the present embodiment, and a ring-shaped mesh type (24 mesh) electrode having an inner diameter/outer diameter of 290 mm/320 mm as the external electrode (i.e., the electrostatic chuck electrode).

As a result of the above experiment, the temperature range of the ceramic heater according to the prior art was about 7.5° C. as shown in FIG. 5A, and the temperature range of the electrostatic chuck heater according to the present embodiment was about 2.7° C. as shown in FIG. 5B. That is, it can be seen that in the electrostatic chuck heater according to the present embodiment, the temperature change range at the edge of the heater is greatly reduced to about 36% of that in the ceramic heater according to the prior art. Therefore, the electrostatic chuck heater according to the present embodiment has an effect of greatly improving the temperature uniformity of the heat treatment target, such as a wafer, compared to the ceramic heater according to the prior art, and as a result the deposition uniformity of the heat treatment target is greatly improved.

FIG. 6 is a view showing the results of measuring the temperature change ranges of wafer edges according to the function and size of the internal and external electrodes of the electrostatic chuck heater according to the present embodiment.

As shown in FIG. 6, in this experiment, the internal electrode was set to perform the RF grounding function, and the external electrode was set to selectively perform the electrostatic chuck function and the RF grounding function. In addition, an experiment was conducted using each of mesh type (24 mesh) electrodes having diameters of 275 mm, 280 mm, and 285 mm for the internal electrode. Each of ring-shaped mesh type (24 mesh) electrodes and having inner diameters/outer diameters of 280/320 mm, 285/320 mm, and 290/320 mm was used for the external electrode.

As a result of the above experiment, it can be seen that when the diameter of the internal electrode is 285 mm and the inner diameter/outer diameter of the external electrode is 290/320 mm, the temperature change range of the wafer edge has the smallest width. In addition, it can be seen that the temperature change range of the wafer edge is smaller when the external electrode performs the electrostatic chuck function than when the external electrode performs the RF grounding function. Accordingly, it can be seen that the functions set for the internal and external electrodes and the diameters of the electrodes are closely related to deposition uniformity and temperature uniformity of a wafer, which shows the performance of the electrostatic chuck heater.

Figure 7:
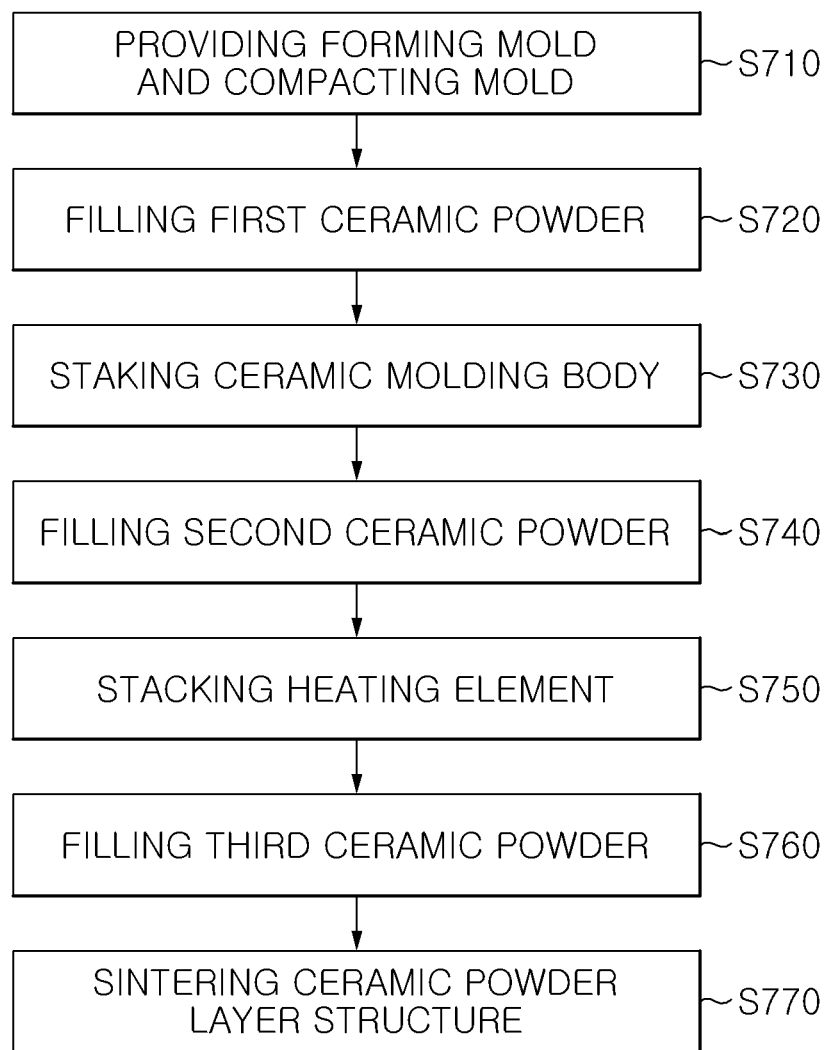
FIG. 7 is a flowchart illustrating a method of manufacturing a heater body constituting the electrostatic chuck heater of FIG. 3.
Figure 8:
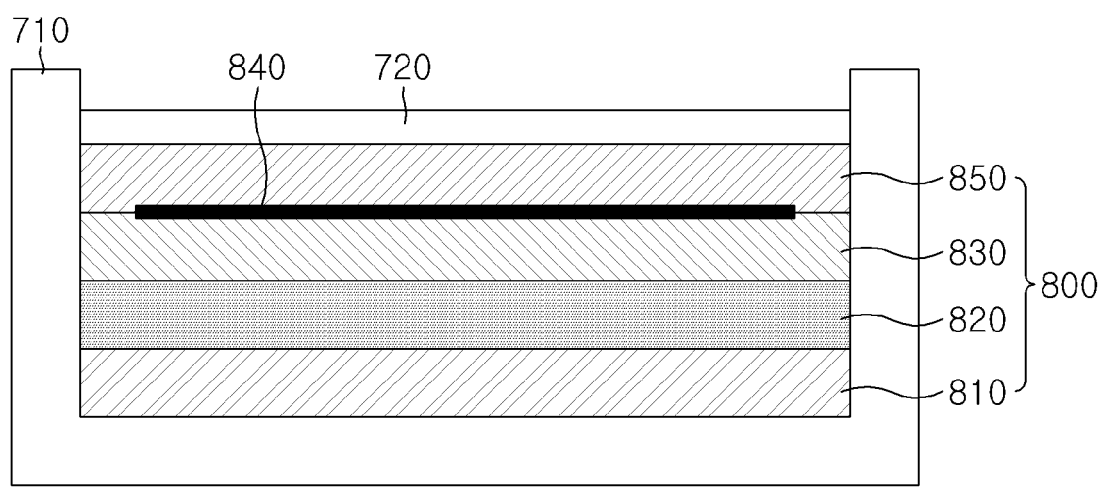
FIG. 8 is a view to be referenced for explaining the method of manufacturing the heater body constituting the electrostatic chuck heater of FIG. 3.
Figure 9A:
FIGS. 9A to 9D are views for explaining a method of manufacturing a ceramic molding body according to an embodiment of the present disclosure.
Figure 9B:
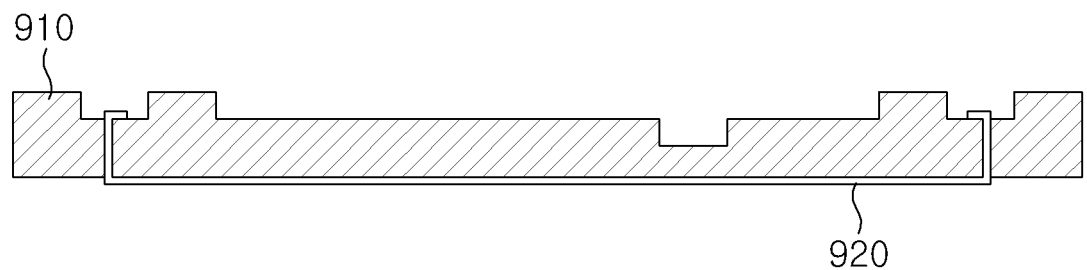
Figure 9C:
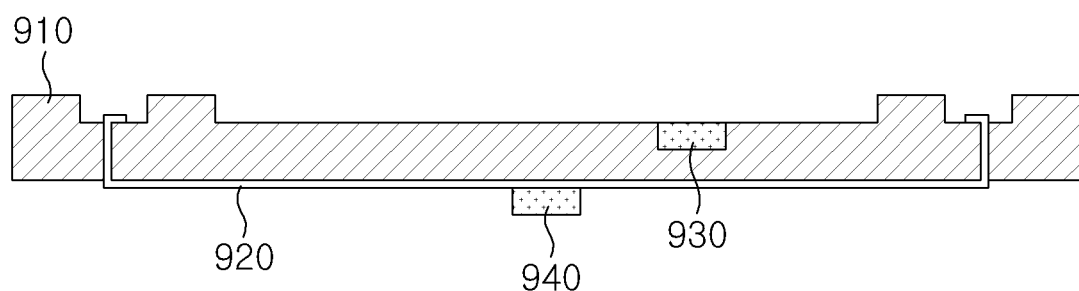
Figure 9D:
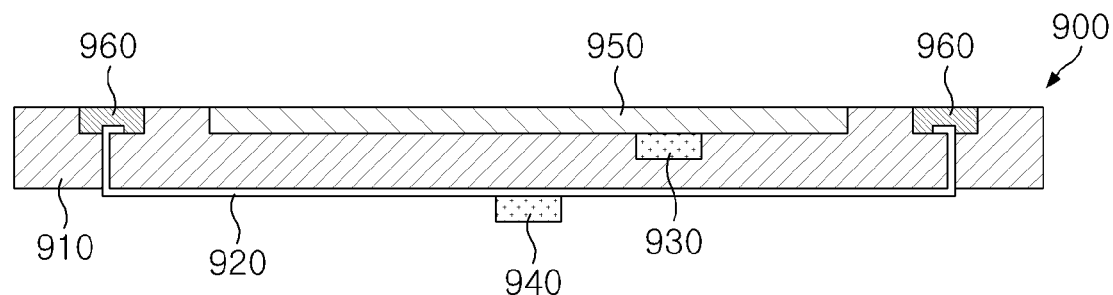

FIG. 7 is a flowchart illustrating a method of manufacturing a heater body constituting the electrostatic chuck heater of FIG. 3, and FIG. 8 is a view to be referenced for explaining the method of manufacturing the heater body constituting the electrostatic chuck heater of FIG. 3.

Referring to FIGS. 7 and 8, a forming mold (or an accommodation mold 710) corresponding to the entire shape of a heater body constituting the electrostatic chuck heater 100 according to an embodiment of the present disclosure and a compacting mold (or a pressuring mold, 720) that applies pressure to ceramic powder filled in the forming mold 710 may be provided (S710).

First ceramic powder may be filled in the forming mold 710 to form a first ceramic powder layer 810 (S720). A ceramic molding body 820 in which an internal electrode (not illustrated), an external electrode (not illustrated), an external electrode connecting member (not illustrated), and the like are embedded may be preprocessed and stacked on the first ceramic powder layer 810 in the forming mold 710 (S730). In this case, the ceramic molding body 820 may be provided in the form of a molding body capable of maintaining the shape thereof by being compacted with a predetermined pressure.

Thereafter, second ceramic powder may be filled above the ceramic molding body 820 in the forming mold 710 to form a second ceramic powder layer 830 (S740). In addition, a heating element 840 having a spiral or mesh-shaped plate-like structure may be preprocessed and stacked on the second ceramic powder layer 830 (S750).

Next, third ceramic powder may be filled above the heating element 840 in the forming mold 710 to form a third ceramic powder layer 850 (S760). The first to third ceramic powders may include aluminum nitride (AlN) powder, and may optionally include about 0.1 to 10% and more preferably about 1 to 5% of aluminum oxide powder.

After sequentially stacking the first ceramic powder layer 810, the ceramic molding body 820, the second ceramic powder layer 830, the heating element 840, and the third ceramic powder layer 850, by providing heat having a high temperature to the first ceramic powder layer 810, the ceramic molding body 820, the second ceramic powder layer 830, the heating element 840, and the third ceramic powder layer 850 while compacting the same with a predetermined pressure using the compacting mold 720, the ceramic powder layers may be sintered to form a heater body 800 (S770). For example, the heater body 800 may be compacted and sintered at a pressure of about 0.01 to 0.3 ton/cm2 and a temperature of about 1600 to 1950° C.

Hereinafter, a method of manufacturing a ceramic molding body 820 capable of selectively performing an RF grounding function and an electrostatic chuck function among the elements constituting the above-described heater body 800 will be described in detail.

FIGS. 9A to 9D are views for explaining a method of manufacturing a ceramic molding body according to an embodiment of the present disclosure.

Referring to FIGS. 9A to 9D, a forming mold (not illustrated) corresponding to the entire shape of a ceramic molding body 900 may be provided. After filling ceramic powder in the forming mold (not illustrated), the ceramic powder may be sintered at a predetermined temperature and pressure to form a ceramic plate 910. In addition, by processing the upper portion of the ceramic plate 910, a first groove in which a first rod connecting member 930 can be embedded, a second groove in which an internal electrode 950 can be embedded, and a third groove in which an external electrode 960 can be embedded may be formed. In addition, the edge portion of the ceramic plate 910 may be processed to form through-holes in which an external electrode connecting member 920 may be embedded.

Thereafter, the external electrode connecting member 920 may be inserted into the ceramic plate 910 in which the plurality of grooves are processed. In this case, the both ends of the external electrode connecting member 920 may be formed to be parallel to the ceramic plate 910 by being bent in a direction horizontal to the ground so as to be electrically connected to the external electrode 960.

When the installation of the external electrode connecting member 920 is completed, a first rod connecting member 930 may be inserted into the first groove formed in the upper portion of the ceramic plate 910. In addition, a second rod connecting member 940 may be attached to the lower surface of the external electrode connecting member 920.

When the installation of the first and second rod connecting members 930 and 940 is completed, the internal electrode 950 may be inserted into the second groove formed in the upper portion of the ceramic plate 910, and the external electrode 960 may be inserted into the third groove formed in the upper portion of the ceramic plate 910. Accordingly, the internal electrode 950 may be electrically connected to the first rod connecting member 930, and the external electrode 960 may be electrically connected to the second rod connecting member 940 via the external electrode connecting member 920.

The external electrode connecting member 920, the internal electrode 950, and the external electrode 960 may be formed in any one of a sheet type, a mesh type, and a paste type. In addition, the external electrode connecting member 920, the internal electrode 950, and the external electrode 960 may be made of molybdenum (Mo) having excellent electrical conductivity. In addition, the external electrode connecting member 920 may be formed in the form of a thin and long plate processed into a "⊏" shape, the internal electrode 950 may be formed in a circular plate shape, and the external electrode 960 may be formed in a ring shape.

However, in the case of the above-described method for manufacturing a ceramic molding body, there may be a problem in that electricity does not flow well between the external electrode 960 and the external electrode connecting member 920 due to a defect in the alignment of the bent portions of the external electrode connecting member 920 that come into contact with the external electrode 960. In addition, there is a possibility that the through-holes in the ceramic plate 910 are not completely filled with powder, and as a result, a defect in the RF grounding function, a defect in the electrostatic chuck function, a product crack problem, or the like may occur. Hereinafter, another method of manufacturing a ceramic molding body capable of solving such a problem will be described.

FIGS. 10A to 10E are views for explaining a method of manufacturing a ceramic molding body according to another embodiment of the present disclosure.

Referring to FIG. 10A, a forming mold 1010 corresponding to the entire shape of a ceramic molding body 1000 may be provided. A ceramic powder 1020 may be filled in the forming mold 1010 to a predetermined height to form a ceramic powder layer. In this case, the ceramic powder 1020 may be formed of aluminum nitride (AlN), but is not necessarily limited thereto.

Thereafter, a jig (jig, 1030) for forming grooves having a predetermined shape in the upper portion of the ceramic powder layer 1020 may be provided. First grooves 1021 may be formed in the upper portion of the ceramic powder layer 1020 filled in the forming mold 1010 by moving the jig 1030 toward the forming mold 1010.

Referring to FIG. 10B, first external electrodes 1060a having a bar shape may be inserted into the first grooves 1021 formed in the upper portion of the ceramic powder layer 1020. When the insertion of the first external electrodes 1060a is completed, ceramic powder may be additionally filled in the forming mold 1010 to sufficiently cover the first external electrodes 1060a. The ceramic plate 1020 may be formed by sintering the ceramic powder layer filled in the forming mold 1010 at a predetermined temperature and pressure. Thereafter, the ceramic plate 1020 may be removed from the forming mold 1010.

Figure 10C:
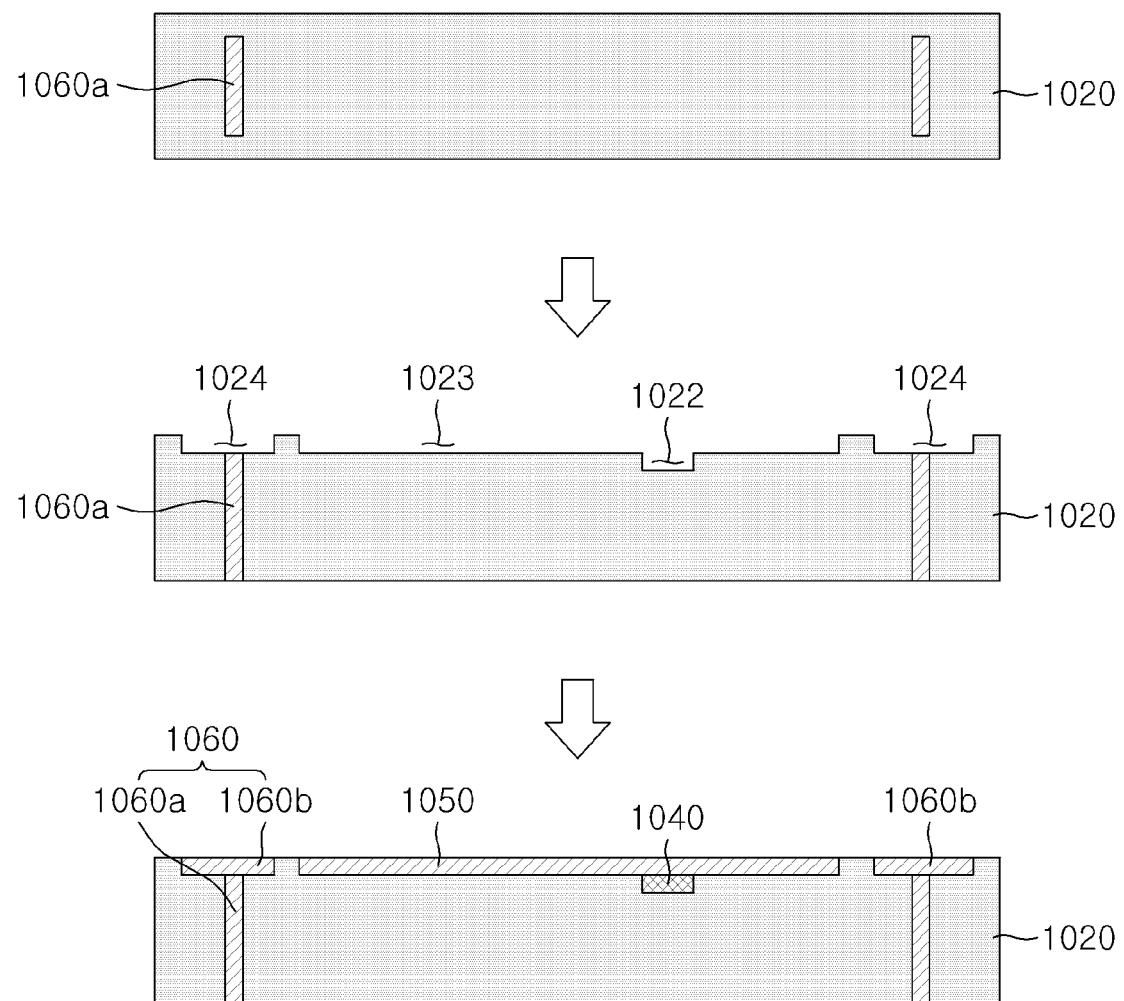

Referring to FIG. 10C, opposite surfaces of the ceramic plate 1020 may be processed such that the first external electrodes 1060a are exposed to the outside. In addition, by processing the upper portion of the ceramic plate 1020, a second groove 1022 in which a first rod connecting member 1040 can be embedded, a third groove 1023 in which an internal electrode 1050 can be embedded, and a fourth groove 1024 in which a second external electrode 1060b can be embedded may be formed.

Thereafter, the first rod connecting member 1040 may be inserted into the second groove 1022 formed in the upper portion of the ceramic plate 1020. When the insertion of the first rod connecting member 1040 is completed, the internal electrode 1050 may be inserted into the third groove 1023 formed in the upper portion of the ceramic plate 1020. As a result, the internal electrode 1050 may be electrically connected to the first rod connecting member 1040.

When the insertion of the internal electrode 1050 is completed, the second external electrode 1060b may be inserted into the fourth groove 1024 formed in the upper portion of the ceramic plate 1020. In this case, the second external electrode 1060b may be coupled to the first external electrodes 1060a to form a single external electrode 1060. Accordingly, the second external electrode 1060b may be electrically connected to the first external electrode 1060a.

Referring to FIGS. 10D and 10E, the external electrode connecting member 1030 may be attached to the lower surface of the ceramic plate 1020 using a screen printer (not illustrated). In this case, the external electrode connecting member 1030 may be disposed on a straight line between the first external electrodes 1060a exposed on the lower surface of the ceramic plate 1020. Accordingly, the external electrode connecting member 1030 may be electrically connected to the first external electrodes 1060a and the second external electrode 1060b.

Figure 11A:
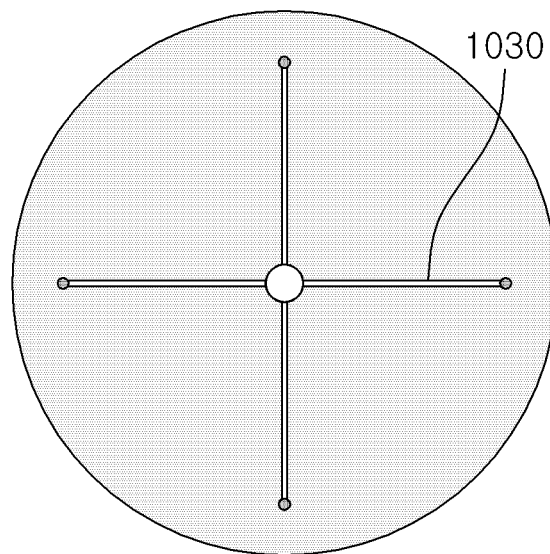
FIGS. 11A and 11B are views illustrating other shapes of an external electrode connecting member embedded in the ceramic molding body of FIG. 10E.
Figure 11B:
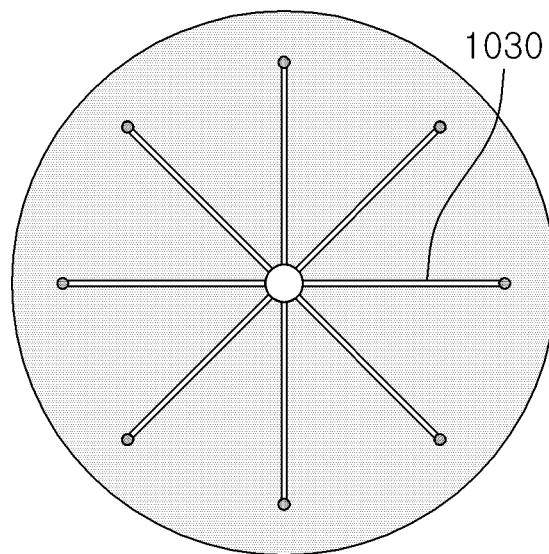

Meanwhile, in the present embodiment, an example in which the external electrode connecting member 1030 attached to the lower surface of the ceramic plate 1020 forms one line is illustrated, but the present disclosure is not limited thereto. For example, as illustrated in FIGS. 11A and 11B, the external electrode connecting member 1030 attached to the lower surface of the ceramic plate 1020 may be formed in two or four lines. In addition, the external electrode connecting member 1030 may be formed in various designs.

Thereafter, a second rod connecting member 1070 may be attached to the central point of the lower surface of the external electrode connecting member 1030. Accordingly, the second rod connecting member 1070 may be electrically connected to the first and second external electrodes 1060a and 1060b via the external electrode connecting member 1030.

The external electrode connecting member 1030, the internal electrode 1050, and the external electrodes 1060 may be formed in any one of a sheet type, a mesh type, and a paste type. In addition, the external electrode connecting member 1030, the internal electrode 1050, and the external electrodes 1060 may be made of molybdenum (Mo) having excellent electrical conductivity. In addition, the external electrode connecting member 1030 may be formed in a long straight band shape, the internal electrode 1050 may be formed in a circular plate shape, and the external electrodes 1060 may be formed in a ring shape.

As described above, in the method for manufacturing a ceramic molding body according to another embodiment of the present disclosure, it is not necessary to insert the external electrode connecting member into through holes in the ceramic plate, and it is not necessary to bend the both ends of the external electrode connecting member in a direction horizontal to the ground. Thus, it is possible to improve product reliability and work convenience compared to the method for manufacturing a ceramic molding body described above with reference to FIGS. 9A to 9D.

According to at least one of the embodiments of the present disclosure, there is an advantage in that by including the internal electrode and the external electrode capable of selectively performing any one of an RF grounding function and an electrostatic chuck function according to a semiconductor process mode, it is possible to improve temperature uniformity and deposition uniformity of a heat treatment target such as a wafer disposed on the upper surface of the heater body.

In addition, according to at least one of the embodiments of the present disclosure, there is an advantage in that, since it is not necessary to insert the external electrode connecting member into a through hole in the ceramic plate during the process of manufacturing the heater body and to bend the both ends of the external electrode connecting member in a direction horizontal to the ground, the product reliability and work convenience of the electrostatic chuck heater can be improved.

However, the effects which can be obtained by the electrostatic chuck heat according to the embodiments of the present disclosure and the method of manufacturing the same are not limited to those described above, and a person ordinarily skilled in the art, to which the present disclosure belongs, could understand other effects, which are not described above, from the following description.

Meanwhile, although specific embodiments of the present disclosure have been described above, various modifications are possible without departing from the scope of the present disclosure. Therefore, the scope of the present disclosure is not limited to the described embodiments, and should be determined based not only on the claims to be described later, but also on equivalents to the claims.

What is claimed is:

1. An electrostatic chuck heater comprising:
   a heater body including an internal electrode and an external electrode configured to selectively perform any one of a radio-frequency (RF) grounding function and an electrostatic chuck function according to a semiconductor process mode; and
   a heater support mounted below the heater body to support the heater body,
   wherein the heater body further includes an external electrode connecting member disposed between an electrode layer and a heating element layer to electrically connect the external electrode and a rod installed in the heater support to each other, and
   wherein the external electrode connecting member is spaced apart from lower surfaces of the internal electrode and the external electrode by a predetermined distance and disposed in parallel to the electrodes, and both ends of the external electrode connecting member are bent toward the lower surface of the external electrode.

2. The electrostatic chuck heater of claim 1, wherein the external electrode is formed on a same plane as the internal electrode.

3. The electrostatic chuck heater of claim 1, wherein the external electrode is disposed to be spaced apart from the internal electrode by a predetermined distance.

4. The electrostatic chuck heater of claim 1, wherein the external electrode is disposed to surround the internal electrode.

5. The electrostatic chuck heater of claim 1, wherein the internal electrode is embedded in an upper central portion of the heater body.

6. The electrostatic chuck heater of claim 1, wherein the internal electrode, the external electrode, and the external electrode connecting member are formed in any one of a sheet type, a mesh type, and a paste type.

7. The electrostatic chuck heater of claim 1, wherein the internal electrode, the external electrode, and the external electrode connecting member are made of molybdenum (Mo) having excellent electrical conductivity.

8. The electrostatic chuck heater of claim 1, further comprising:
   a bipolar function selector electrically connected to the internal electrode and the external electrode embedded in the heater body to select functions of the internal electrode and the external electrode.

9. The electrostatic chuck heater of claim 8, wherein the bipolar function selector includes an internal electrode function selector configured to select a function of the internal electrode and an external electrode function selector configured to select a function of the external electrode.

10. The electrostatic chuck heater of claim 9, wherein the internal electrode function selector includes a first capacitor C1, a first switch S1, and a first DC power supply configured to supply a positive DC voltage V1, and
    the external electrode function selector includes a second capacitor C2, a second switch S2, and a second DC power supply configured to supply a negative DC voltage V2.

11. The electrostatic chuck heater of claim 8, wherein the bipolar function selector is configured to select the functions of the electrodes such that at least one of the internal electrode and the external electrode performs the RF grounding function in a first semiconductor process mode.

12. The electrostatic chuck heater of claim 8, wherein the bipolar function selector is configured to select the functions of the electrodes such that both the internal electrode and the external electrode perform the electrostatic chuck function in a second semiconductor process mode.

* * * * *